& Neustadt, L.L.P.

United States Patent
Dobashi et al.

(10) Patent No.: US 9,099,298 B2
(45) Date of Patent: Aug. 4, 2015

(54) SUBSTRATE CLEANING APPARATUS AND SUBSTRATE CLEANING METHOD

(75) Inventors: Kazuya Dobashi, Nirasaki (JP); Takashi Fuse, Fremont, CA (US)

(73) Assignees: TOKYO ELECTRON LIMITED, Tokyo (JP); IWATANI CORPORATION, Osaka-shi (JP)

( * ) Notice: Subject to any disclaimer, the term of this patent is extended or adjusted under 35 U.S.C. 154(b) by 305 days.

(21) Appl. No.: 13/617,530

(22) Filed: Sep. 14, 2012

(65) Prior Publication Data

US 2013/0008470 A1     Jan. 10, 2013

Related U.S. Application Data

(63) Continuation of application No. PCT/JP2011/056167, filed on Mar. 16, 2011.

(30) Foreign Application Priority Data

Mar. 18, 2010   (JP) .................................. 2010-062770

(51) Int. Cl.
| | | |
|---|---|---|
| B08B 3/02 | (2006.01) | |
| H01L 21/02 | (2006.01) | |
| H01L 21/67 | (2006.01) | |
| H01L 21/311 | (2006.01) | |

(52) U.S. Cl.
CPC ...... *H01L 21/02052* (2013.01); *H01L 21/0206* (2013.01); *H01L 21/31133* (2013.01); *H01L 21/67051* (2013.01)

(58) Field of Classification Search
CPC ................................................. H01L 21/02052
See application file for complete search history.

(56) References Cited

U.S. PATENT DOCUMENTS 6,449,873 B1    9/2002  Yoon et al.
2006/0086459 A1*  4/2006  Koga et al. ............... 156/345.19

(Continued)

FOREIGN PATENT DOCUMENTS

JP     2000-325894 A    11/2000
JP     2001-137797 A     5/2001

(Continued)

OTHER PUBLICATIONS

English machine translation of JP2005-347326A.*

(Continued)

*Primary Examiner* — Michael Barr
*Assistant Examiner* — Jason Riggleman
(74) *Attorney, Agent, or Firm* — Oblon, McClelland, Maier & Neustadt, L.L.P.

(57) ABSTRACT

A substrate cleaning device is capable of removing more diverse contaminants from substrates than ultra-low temperature aerosol ejection, while avoiding technical problems inherent to wet cleaning, such as micro-roughness, watermarks, loss of substrate material and destruction of the device structure. A substrate cleaning device for cleaning wafers to which cleaning target objects have adhered includes a cluster spraying unit which sprays the wafer with one or more types of clusters formed of cleaning preparation molecules agglomerated together, a suction unit which sucks the cleaning target objects separated by spraying the clusters of the cleaning agent molecules; and a unit for moving the wafer and the cluster spraying unit relative to the one another along the surface of the wafer W to which the cleaning target objects have adhered.

9 Claims, 13 Drawing Sheets

(56) References Cited

U.S. PATENT DOCUMENTS

2007/0051389 A1* 3/2007 Ashjaee .................. 134/33
2008/0006299 A1* 1/2008 Orii et al. ................. 134/10

FOREIGN PATENT DOCUMENTS

| JP | 2005-347326 A | * | 12/2005 | ............ H01L 21/027 |
| JP | 2007-301442 A |   | 11/2007 | |
| JP | 2008-135681 A |   | 6/2008 | |
| KR | 2001-0047111 A |  | 6/2001 | |
| KR | 2003-0082422 A |  | 10/2003 | |

OTHER PUBLICATIONS

International Search Report issued Jun. 21, 2011 in PCT/JP2011/056167 filed Mar. 16, 2011 (with English Translation).

Office Action issued Aug. 8, 2013 in Korean Patent Application No. 10-2012-7027213.

* cited by examiner

FIG.4

| CLEANING TARGET OBJECTS | TYPES OF GAS CLUSTERS | | |
|---|---|---|---|
| | FIRST NOZZLE | SECOND NOZZLE | THIRD NOZZLE |
| RESIST | ORGANIC SOLVENT (SWELLING) | N₂ | |
| RESIST (CLUSTER) | ORGANIC SOLVENT (SWELLING) | ORGANIC SOLVENT (DETERIORATION) | N₂ |
| SiO | H₂O | HF | IPA -> N₂ (DRY) |
| METAL | HCl | O₃ | N₂ |
| ORGANIC MATERIAL | O₃ | N₂ | |
| PARTICLES | N₂, Ar | N₂ | |
| ION (F, CL, NH4) | H₂O | IPA (DRY) | N₂ |

IRRADIATION OF ION BEAM

SPRAYING OF CLUSTER

SUBSTRATE

SUBSTRATE

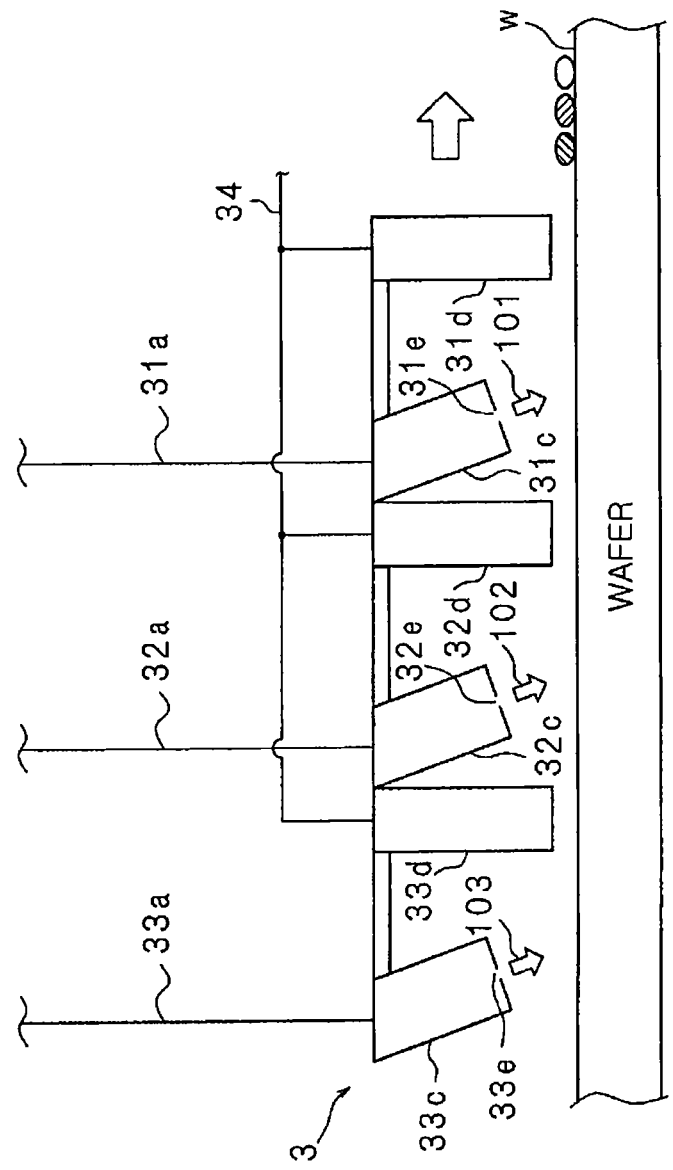

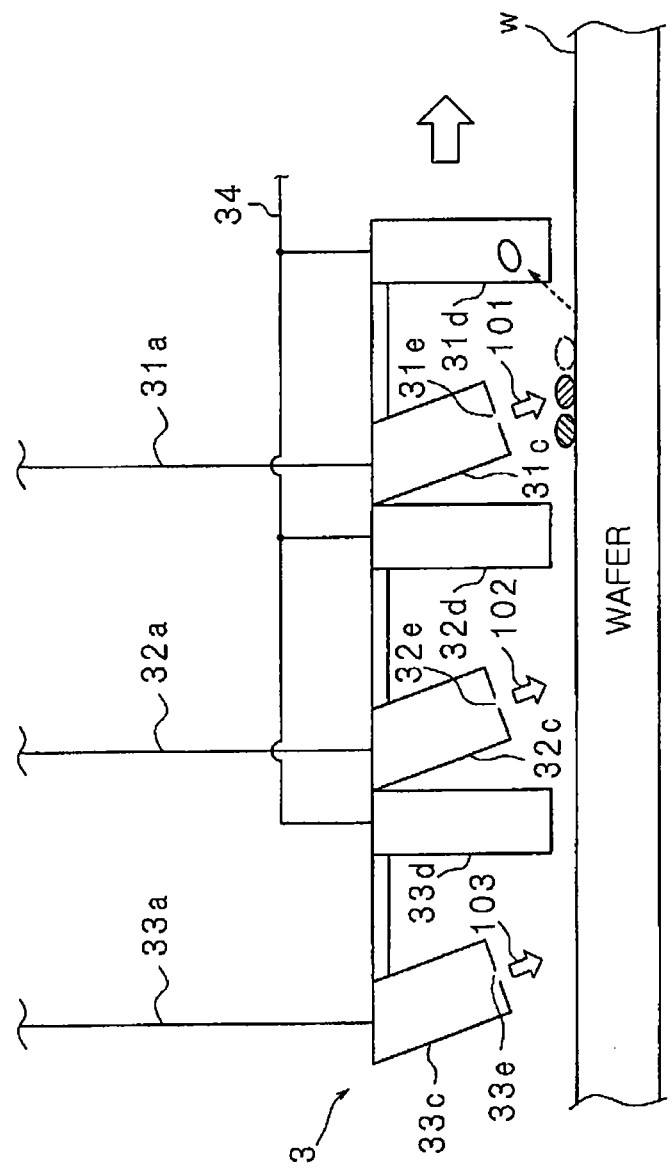

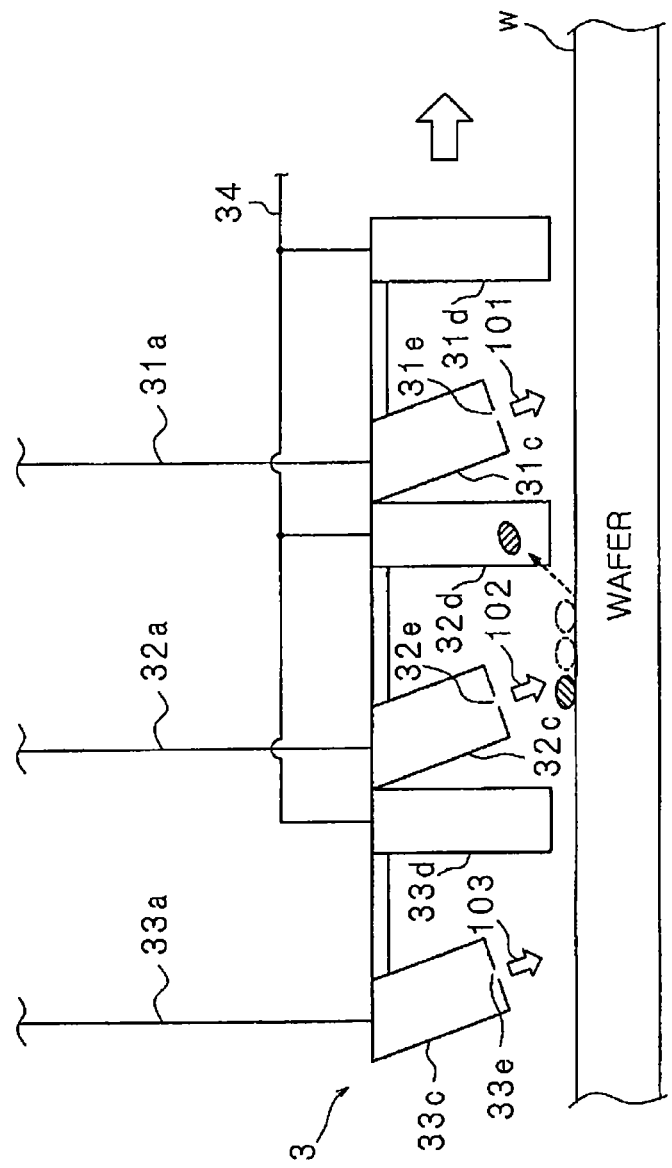

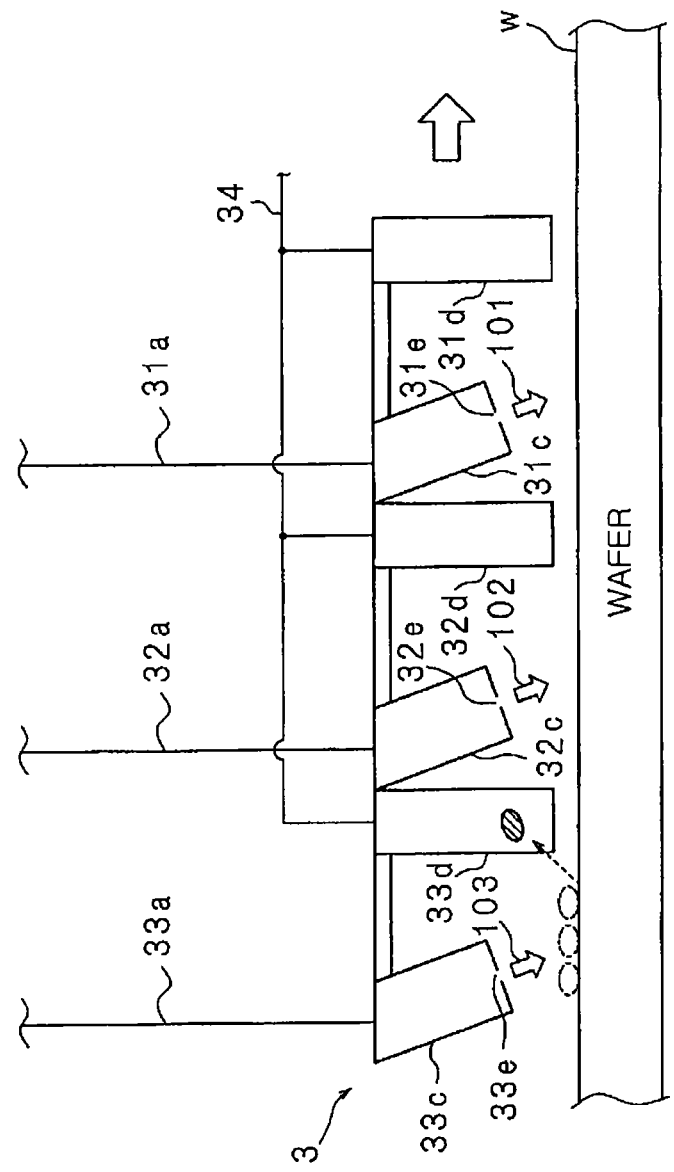

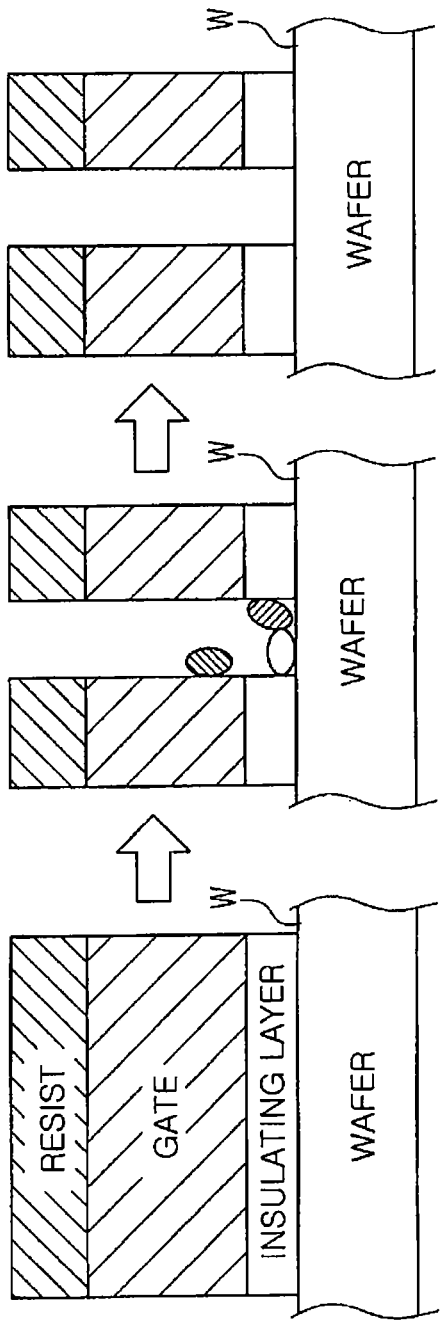

SUBSTRATE CLEANING APPARATUS AND SUBSTRATE CLEANING METHOD

This application is a Continuation Application of PCT International Application No. PCT/JP2011/056167 filed on Mar. 16, 2011, which designated the United States.

FIELD OF THE INVENTION

The present invention relates to a substrate cleaning apparatus and a substrate cleaning method for cleaning a substrate to which cleaning target objects have adhered.

BACKGROUND OF THE INVENTION

Wet cleaning using water is employed for wafer cleaning performed after various substrate processes. Japanese Patent Application Publication No. 2000-325894 (JP2000-325894A) describes a substrate cleaning apparatus including a rotation unit for rotating a wafer, a line-shaped ejection nozzle for ejecting cleaning liquid to a wafer in a line shape, and a moving unit for moving the line-shaped ejection nozzle along the wafer. In accordance with the substrate cleaning apparatus described in JP2000-325894A, even a large-sized wafer can be cleaned by cleaning water while ensuring high throughput and high cleaning performance.

Meanwhile, in order to prevent deterioration of device performance due to a microscale roughness of a wafer surface, a loss of a substrate material or the like, there is proposed a wet cleaning method using a diluted cleaning agent. In this wet cleaning method, deterioration of cleaning performance due to the dilution of the cleaning agent is compensated by a physical supplementary process. The physical supplementary process may include ultrasonic cleaning, two-fluid jet cleaning or the like. In the two-fluid jet cleaning, pure water and high pressure nitrogen gas are mixed and sprayed from a nozzle in a form of minute liquid droplets, and contaminants are removed by using shock waves generated by collision of the minute liquid droplets with the wafer surface.

However, the conventional wet cleaning method has the following technical problems caused by miniaturization and complication of device structures formed on a wafer.

First problem: When a physical supplementary process such as an ultrasonic wave, two-fluid spray or the like is used, a miniaturized device structure may be physically damaged.

Second problem: The miniaturized device structure may be collapsed by surface tension of water.

Third problem: When a substrate may be dried after wet cleaning, a watermark is generated on the surface of the substrate which leads to defects and deterioration of device performance.

Fourth problem: A water-soluble material formed on a substrate, e.g., lanthanum (La), may be damaged by a cleaning process.

Fifth problem: A substrate material, other than cleaning target objects, formed on a substrate may be lost by cleaning.

Sixth problem: A device structure may be broken by electric discharge generated between a substrate and water charged with electricity during a cleaning process.

As for a method for solving the above technical problems in the wet cleaning, there is suggested an ultra-low temperature aerosol ejection method using $N_2$ gas and Ar gas. However, contaminants that can be cleaned are limited, and it is difficult to remove various contaminants.

SUMMARY OF THE INVENTION

In view of the above, the present invention provides a substrate cleaning apparatus and a substrate cleaning method, capable of removing various contaminants from a substrate, compared to an extreme low-temperature spraying method, while avoiding technical problems inherent to wet cleaning, such as micro-roughness, watermarks, loss of substrate material, destruction of the device structure or the like, by spraying a substrate with clusters formed of a plurality of different cleaning agent molecules and sucking cleaning target objects separated by the spraying of the clusters.

In accordance with one aspect of the present invention, there is provided a substrate cleaning apparatus for cleaning a substrate to which cleaning target objects have adhered, including: a cluster spraying unit for spraying the substrate with one or more types of clusters formed of cleaning agent molecules agglomerated together; a suction unit for sucking cleaning target objects separated by spraying the clusters of the cleaning agent molecules; and a unit for relatively moving the substrate and the cluster spraying unit along a surface of the substrate to which the cleaning target objects have adhered.

Preferably, the substrate cleaning apparatus may further include a container for accommodating the substrate; a vacuum pump for decreasing a pressure in the container; and cleaning agent accommodating units which accommodate cleaning agents, wherein the cluster spraying unit includes: supply lines for supplying the cleaning agent from the cleaning agent accommodating units to the container; and a plurality of nozzles for spraying the cleaning agents supplied through the supply lines, and wherein the nozzles are installed side by side.

Preferably, the suction unit may have a plurality of suction members, and each of the suction members being provided to each of the nozzles.

In accordance with another aspect of the present invention, there is provided a substrate cleaning apparatus for cleaning a substrate to which cleaning target objects have adhered, including: a cluster spraying unit for spraying the substrate with one or more types of clusters formed of cleaning agent molecules agglomerated together; a unit for ejecting onto a substrate a transfer gas for transferring cleaning target objects separated by spraying the clusters of the cleaning agent molecules to the outside; and a unit for relatively moving the substrate and the cluster spraying unit along a surface of the substrate to which the cleaning target objects have adhered.

Preferably, the substrate cleaning apparatus may further include a container for accommodating the substrate; a vacuum pump for decreasing a pressure in the container; and cleaning agent accommodating units which accommodate cleaning agents, wherein the cluster spraying unit has: supply lines for supplying the cleaning agents from the cleaning agent accommodating units to the container; and a plurality of nozzles for spraying the cleaning agent supplied through the supply line, the nozzles being installed side by side.

Preferably, a spraying opening of each of the nozzles may have a line-shaped cross section.

Preferably, the substrate cleaning apparatus may further include a holding member which holds the nozzles such that spraying directions of the cleaning agents are not perpendicular to the substrate.

Preferably, the cleaning agent molecules may be selected from the group consisting of an organic solvent, hydrogen fluoride, hydrochloric acid, ozone, ammonia and hydrogen peroxide, water, isopropyl alcohol, nitrogen, and argon.

In accordance with still another aspect of the present invention, there is provided a substrate cleaning method for cleaning a substrate to which cleaning target objects have adhered, including: spraying the substrate with one or more types of clusters of cleaning agent molecules agglomerated together;

sucking cleaning target objects separated by spraying the clusters of the cleaning agent molecules; and changing a spraying location of the clusters.

In accordance with still another aspect of the present invention, there is provided a substrate cleaning method for cleaning a substrate to which cleaning target objects have adhered, including: spraying the substrate with one or more types of clusters of cleaning agent molecules united together; ejecting onto a substrate a transfer gas for transferring the cleaning target objects separated by spraying the clusters of the cleaning agent molecules; and changing a spraying location of the clusters.

In the present invention, the substrate is scanned while being sprayed with one or more types of clusters formed of cleaning agent molecules agglomerated together by the cluster spraying unit. When the clusters of the cleaning agents reach the substrate surface, the cleaning agent molecules are diffused on the surface of the substrate in a high density state similar to liquid, and the liquid cleaning agents act on the cleaning target objects. Accordingly, the cleaning target objects can be separated. The cleaning target objects separated by the spraying of the clusters are sucked by the suction units, thereby preventing readhesion of the cleaning target objects to the substrate. Further, more various cleaning target objects are separated by the clusters of the cleaning agent molecules sprayed to the substrate, compared to the case of using the ultra-low temperature aerosol ejection.

In addition, since cleaning using water is not used, it is possible to solve the technical problems of the wet etching, such as micro-roughness, watermarks, loss of substrate material and destruction of the device structure.

When an ion beam is irradiated, the substrate may be damaged by ions and electrons. However, when the clusters of the cleaning agents are sprayed to the substrate, the organic solvent molecules are diffused along the substrate surface without damaging the substrate.

In the present invention, the pressure in the container is decreased by the vacuum pump. The nozzles forming the cluster spraying unit are installed side by side, and each nozzle sprays a cleaning agent supplied from the cleaning agent accommodating unit through the supply line. The temperature of each cleaning agent sprayed from each nozzle is decreased by adiabatic expansion, and the cleaning agent is clustered.

In the present invention, the nozzles are respectively provided with the suction members, so that it is possible to effectively remove the cleaning target objects by the spraying of the clusters of the cleaning agents.

In the present invention, the substrate is scanned while being sprayed with clusters formed of a plurality of cleaning agent molecules by the cluster spraying unit. The spraying of the clusters of the cleaning agent provides the aforementioned effects. The cleaning target objects separated by the spraying of the clusters are moved to the outside by the transfer gas, so that the readhesion of the cleaning target objects to the substrate is prevented.

In the present invention, the pressure in the container is decreased by the vacuum pump. The nozzles forming the cluster spraying unit are installed side by side, and each nozzle sprays the cleaning agent supplied from the cleaning agent accommodating portion through the supply line. The temperature of the cleaning agent sprayed from each nozzle is decreased by adiabatic expansion, and the cleaning agent is turned into clusters.

In the present invention, the spraying opening of each of the nozzles has a line-shaped cross section, so that the substrate can be effectively cleaned.

In the present invention, the nozzles are held by the support member such that the spraying directions of the cleaning agents are not perpendicular to the substrate. Therefore, the nozzles are moved to the outer side of the substrate while spraying the clusters, and the cleaning target objects separated from the substrate can be blown to the outer side of the substrate by the spraying of the clusters.

In the present invention, it is possible to remove a resist, a silicon oxide SiOx, a metal-based residue, an organic-based residue, various particles or ions.

Effects of the Invention

In accordance with the present invention, more various contaminants can be removed from a substrate, compared to an ultra-low temperature spraying method, while avoiding technical problems inherent to wet cleaning, such as microscale roughness, watermarks, loss of substrate material, destruction of the device structure or the like.

BRIEF DESCRIPTION OF THE DRAWINGS

FIG. 4 is a table showing examples of a first to a third cleaning agent.

FIG. 6 conceptually explains an example of a substrate cleaning method in accordance with an embodiment of the present invention.

FIG. 7 conceptually explains the example of the substrate cleaning method in accordance with the embodiment of the present invention.

FIG. 8 conceptually explains the example of the substrate cleaning method in accordance with the embodiment of the present invention.

FIG. 9 conceptually explains the example of the substrate cleaning method in accordance with the embodiment of the present invention.

FIGS. 10A to 10C conceptually explain an example of a substrate cleaning method performed by using four cleaning agents.

DETAILED DESCRIPTION OF THE EMBODIMENTS

Hereinafter, an embodiment of the present invention will be described in detail with reference to the accompanying drawings which form a part hereof. A substrate cleaning apparatus in accordance with the embodiment of the present invention cleans a substrate to which cleaning target objects have adhered. Particularly, the substrate cleaning apparatus of the present embodiment can remove various contaminants from a substrate, compared to ultra-low temperature aerosol ejection, while avoiding the technical problems inherent to the wet cleaning.

<Substrate Cleaning Apparatus>

Figure 1:
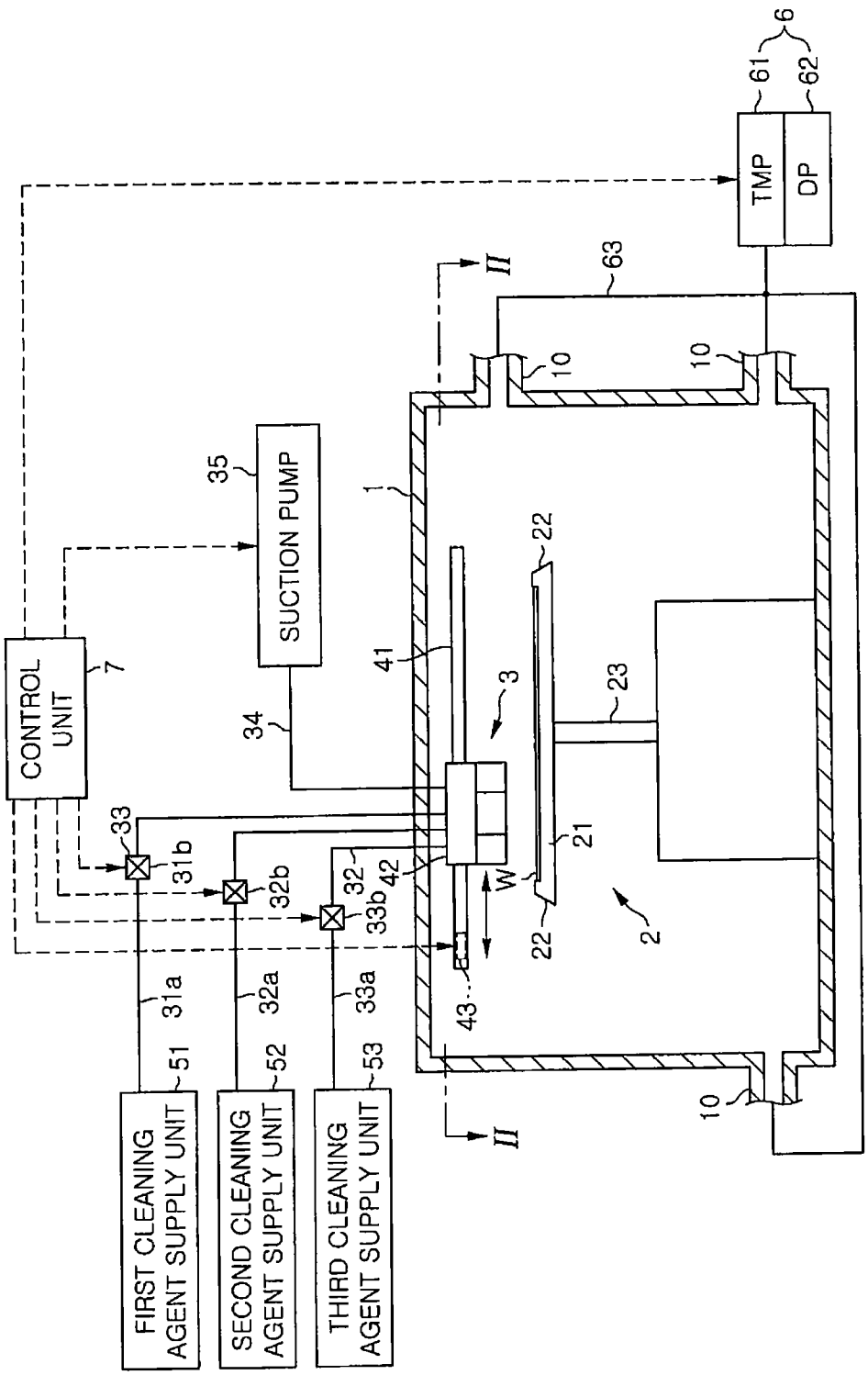
FIG. 1 is a side cross sectional view schematically showing a configuration example of a substrate cleaning apparatus in accordance with an embodiment of the present invention.
Figure 2:
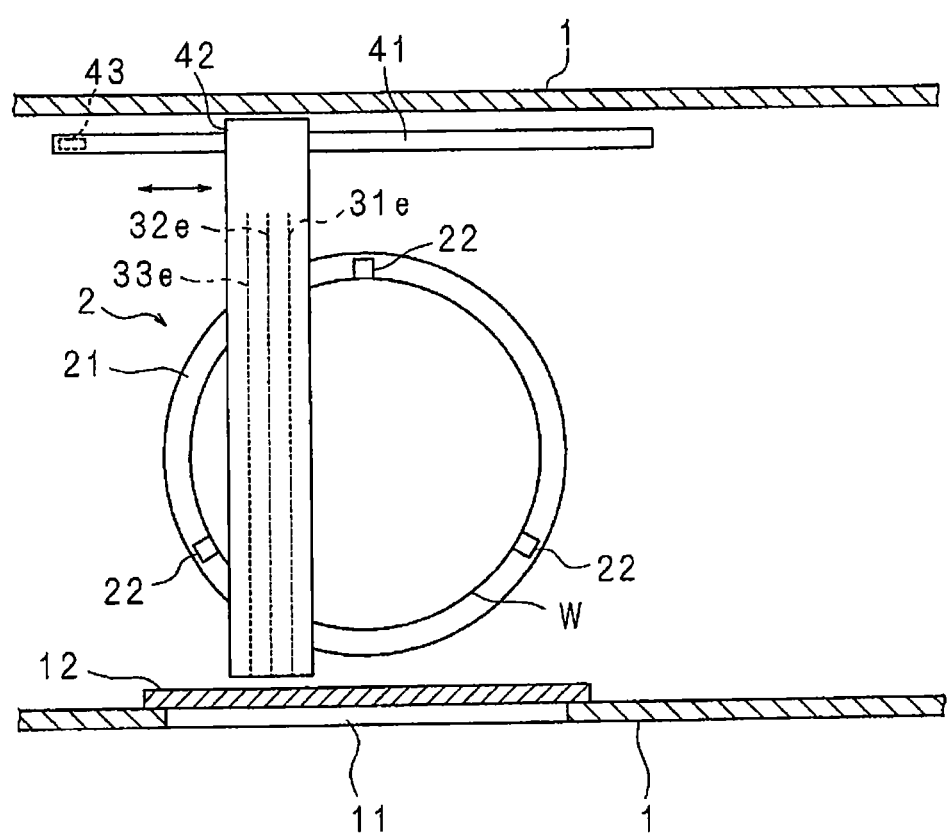
FIG. 2 is a cross sectional view taken along line II-II of FIG. 1.
Figure 3:
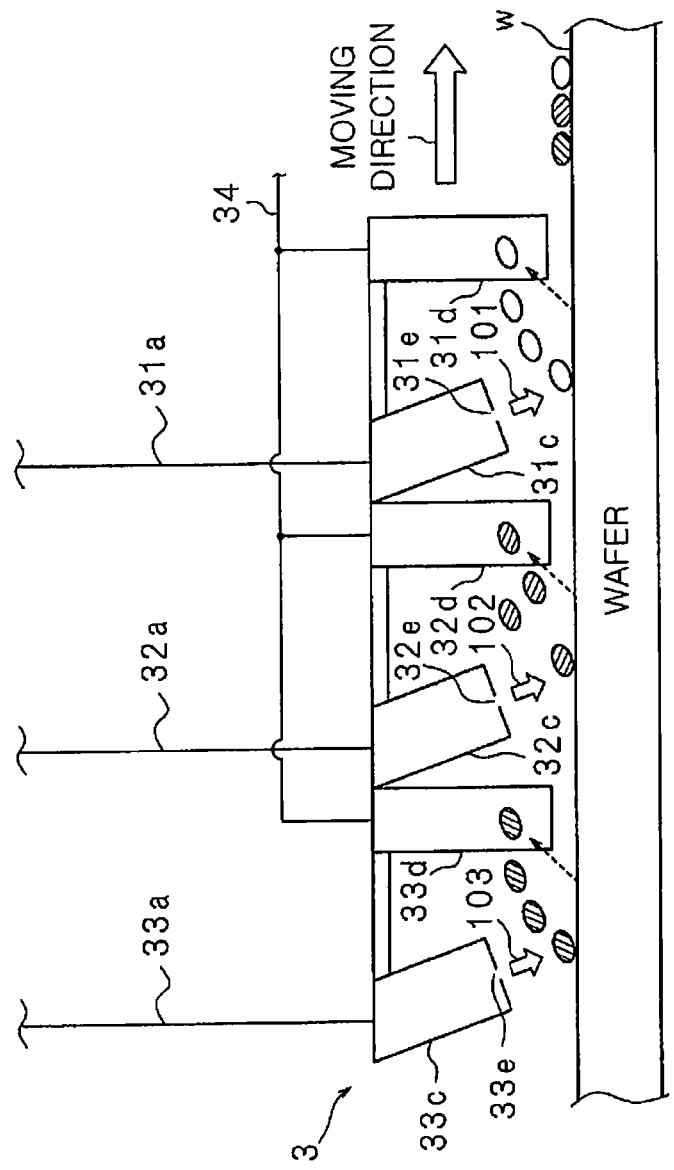
FIG. 3 is a side cross sectional view schematically showing a configuration example of a cluster spraying head.

FIG. 1 is a side cross sectional view schematically showing a configuration example of the substrate cleaning apparatus in accordance with the embodiment of the present invention; FIG. 2 is a cross sectional view taken along line II-II of FIG. 1; and FIG. 3 is a side cross sectional view schematically showing a configuration example of a cluster spraying head 3. The substrate cleaning apparatus of the present embodiment includes a substantially rectangular parallelepiped hollow processing chamber (container) 1 for accommodating a wafer W. As shown in FIG. 2, the processing chamber 1 is provided with a loading/unloading port 11 for loading and unloading the wafer W into and from the processing space in the processing chamber 1. By closing the loading/unloading port 11 with a door body 12, the processing space can be airtightly sealed.

A wafer support 2 for substantially horizontally supporting the wafer W is provided in the processing chamber 1. The wafer support 2 has a table portion 21 on which the wafer W is mounted. As shown in FIG. 2, three holding members 22 are provided on the table portion 21 to substantially horizontally hold the wafer W while being in contact with three locations of the circumferential edge of the wafer W. The table portion 21 has a shaft portion 23 projecting downward from a substantially central portion thereof, and a lower end portion of the shaft portion 23 is fixed to the processing chamber 1.

Provided at an upper portion of the processing chamber 1 is the cluster spraying head 3 for spraying the wafer W with different clusters which are formed of specific cleaning agent molecules agglomerated together and sucking the cleaning target objects separated by the spraying of the clusters. The cluster spraying head 3 is formed in a rod shape having a longitudinal length greater than a diameter of the wafer W. As shown in FIG. 3, the cluster spraying head 3 has a first to a third nozzle 31c to 33c for spraying a first to a third cleaning agent supplied through a first to a third cleaning agent supply line 31a to 33a to be described later, respectively. The first to the third nozzle 31c to 33c are installed side by side in the moving direction of the cluster spraying head 3. Hereinafter, the first to the third cleaning agent will be referred to as "cleaning agent" when the configuration commonly used for the first to the third cleaning agent is explained. As shown in FIG. 2, each of the cross section of spraying openings 31e to 33e of the first to the third nozzle 31c to 33c has a line shape, and a longitudinal length of each of the spraying openings is greater than a diameter of the wafer W. In a state where the inside of the processing chamber 1 is depressurized, the cleaning agents sprayed form the first to the third nozzle 31c to 33c are clustered by adiabatic expansion. In the cluster spraying head 3, a first to a third suction members 31d to 33d are provided correspondingly to the first to the third nozzle 31c to 33c, respectively, to suck the cleaning target objects separated by the clusters of the cleaning agent molecules which are sprayed from the first to the third nozzle 31c to 33c. The first to the third suction units 31d to 33d are connected to a suction pump 35 via a suction line 34. The first to the third nozzle 31c to 33c constitute a cluster spraying unit, and the first to the third suction units 31d to 33d constitute a suction unit for sucking cleaning target objects separated by spraying of clusters of cleaning agent molecules.

The first to the third nozzle 31c to 33c are held by a nozzle arm (holding member) 42. The nozzle arm 42 is provided above the wafer W supported by the wafer support 2 and holds the nozzles such that the spraying directions of the first to the third cleaning agent are not perpendicular to the wafer W. The base end of the nozzle arm 42 is supported so as to be movable along a guide rail 41 disposed in a substantially horizontal direction. Further, there is provided a driving unit 43 for moving the nozzle arm 42 along the guide rail 41. The guide rail 41 and the driving unit 43 constitute a moving unit for moving the cluster spraying head 3 held by the nozzle arm 42 along the surface of the wafer W. By driving the driving unit 43, the nozzle arm 42 can be moved, above the wafer W, between diametrically opposite positions outward of the circumferential edge of the wafer W. The operation of the driving unit 43 is controlled by the control unit 7. The guide rail 41 and the driving unit 43 serve as a unit for relatively moving the substrate and the cluster spraying unit along the surface of the substrate to which cleaning target objects have adhered.

The first to the third nozzle 31c to 33c are connected to a first to a third cleaning agent supply pipe (supply line) 31a to 33a connected to a first to a third cleaning agent supply unit 51 to 53 which accommodate a first to a third cleaning agent, respectively. The first to the third cleaning agent supply pipe 31a to 33a supply the first to the third cleaning agent in a gas phase state from the third to the third cleaning agent supply unit 51 to 53 into the processing chamber 1. The first to the third cleaning agent supply pipe 31a to 33a are provided with a first to a third on-off valve 31b to 33b, respectively. The on-off operations of the first to the third on-off valve 31b to 33b are controlled by the control unit 7.

FIG. 4 is a table showing examples of the first to the third cleaning agents. As shown in FIG. 4, the first to the third cleaning agent can be properly selected based on types of cleaning target objects. For example, in order to remove a resist, it is preferable to employ an organic solvent for the first cleaning agent and $N_2$ gas for the second cleaning agent. In order to remove a resist having a cluster layer formed by high dose ion implantation, it is preferable to employ an organic solvent for the first and the second cleaning agent and $N_2$ gas for the third cleaning agent. In order to remove silicon monoxide SiO, it is preferable to employ water for the first cleaning agent, hydrogen fluoride for the second cleaning agent, and isopropyl alcohol IPA and $N_2$ gas for the third cleaning agent. In order to remove metal, it is preferable to employ hydrochloric acid (HCl) for the first cleaning agent, $O_3$ for the second cleaning agent, and $N_2$ gas for the third cleaning agent. In order to remove an organic material other than the resist, it is preferable to employ $O_3$ for the first cleaning agent and $N_2$ gas for the second cleaning agent. In order to remove particles, it is preferable to employ ammonia and hydrogen peroxide mixture (APM) for the first cleaning agent, $N_2$ gas for the second cleaning agent, or it is preferable to employ $N_2$ gas or Ar gas for the first cleaning agent. In order to remove ions of F, Cl, and $NH_4$, it is preferable to employ $H_2O$ for the first cleaning agent, isopropyl alcohol (IPA) for the second cleaning agent, and $N_2$ gas for the third cleaning agent.

When different types of cleaning target objects need to be removed, cleaning agents required to remove the cleaning target objects are sequentially sprayed in the form of clusters. It is also possible to properly select a cleaning agent that can be commonly used for the cleaning target objects. For example, when a resist, an organic material other than the resist and particles need to be removed, it is preferable to use an organic solvent for a first cleaning agent, $O_3$ for a second cleaning agent and $N_2$ gas for a third cleaning agent.

Besides, gas exhaust ports 10 are provided at proper locations of the processing chamber 1. Each of the gas exhaust ports 10 is connected to the vacuum pump 6 for decreasing the pressure in the processing chamber 1 to, e.g., about 10 Pa, via a line 63. Since the cleaning agent is clustered by adiabatic expansion of the cleaning agent, it is preferable to decrease the pressure in the vicinity of the cluster spraying head 3. For example, as shown in FIG. 1, it is preferable to provide the first gas exhaust port 10 near the cluster spraying head 3 and provide the second and the third gas exhaust port 10 at lower portions of sidewalls of the processing chamber 1. The vacuum pump 6 includes, e.g., a turbo molecules pump (TMP) 61, and a dry vacuum pump (DP) 62 provided at an upstream side thereof for rough exhaust. The operation of the vacuum pump 6 is controlled by the control unit 7.

Figure 5A:
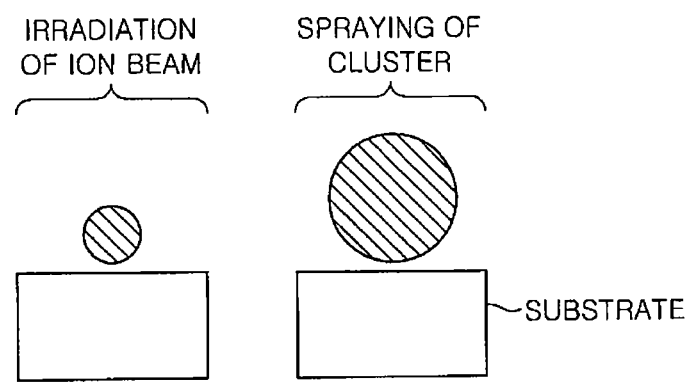
FIGS. 5A and 5B explain difference between spraying of clusters to a substrate and irradiation of ion beams to a substrate.
Figure 5B:
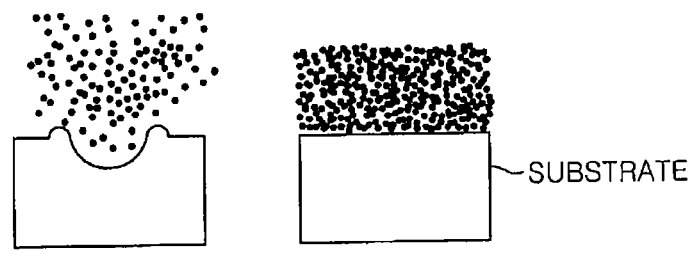

FIGS. 5A and 5B explain difference between spraying of clusters to the substrate and irradiation of ion beams to the substrate. The following is description of simulation showing the state of the substrate and the movement of argon atoms in the case of irradiating ion beams of argon atoms to the substrate and spraying clusters of argon atoms to the substrate. The movements of the ion beams of the cleaning agent molecules and the clusters of the cleaning agent molecules are the same as those of the argon atoms. FIGS. 5A and 5B show the substrates before and after the irradiation of ion beams and the spraying of clusters, and also show the argon ions and the clusters of the argon ions which are sprayed to the substrate. FIG. 5A illustrates an ion beam formed of, e.g., about 2000 argon atoms. The ion beam has the energy of about 20 KeV. Therefore, each of the argon atoms forming the ion beam formed of about 2000 argon atoms has the energy of about 10 eV. If the argon atoms of high energy collide with the substrate, the substrate is physically damaged as shown in FIG. 5B. In addition, the defects of the device and the performance deterioration are caused.

Meanwhile, the right side of FIG. 5B shows clusters of, e.g., about 20000 argon atoms. As in the case of the ion beam, the clusters have the energy of about 20 KeV. Therefore, each of the argon atoms forming the clusters formed of about 20000 argon atoms has the energy of about 1 eV. If the argon atoms of low energy collide with the substrate, the argon atoms are diffused on the surface of the substrate in a high density state similar to liquid without damaging the substrate as shown in FIG. 5B.

The result of the above simulation shows that when the clusters of the cleaning agent are sprayed to the wafer W, the cleaning agent molecules are diffused on the surface of the wafer W in a high density state similar to liquid without damaging the wafer W. Since the cleaning agent molecules are diffused on the surface of the wafer W in a state similar to liquid, it is considered that the reaction between the cleaning agent and the cleaning target objects is similar to liquid phase reaction, and it is expected that the cleaning target objects can be effectively removed by the cleaning agent.

<Substrate Cleaning Method>

Hereinafter, the method for removing cleaning target objects from a wafer W by using the above-described substrate cleaning apparatus will be described.

FIGS. 6 to 9 conceptually explain the example of the substrate cleaning method in accordance with an embodiment of the present invention. As shown in FIG. 6, three types of cleaning target objects that can be respectively cleaned by the first to the third cleaning agent are adhered to the wafer W. First, the control unit 7 decreases the pressure in the processing chamber 1 to about 10 Pa by driving the vacuum pump 6, and moves the cluster spraying head 3 to one end side (e.g., the left end side in FIG. 1) of the wafer W by controlling the operation of the driving unit 43. Further, the control unit 7 makes the first to the third on-off valve 31b to 33b open to supply the first to the third cleaning agent to the first to the third nozzle 31c to 33c, respectively. Next, the control unit 7 controls the suction pump 35 to suck the cleaning target objects separated by spraying of the clusters of the first to the third cleaning agent. In addition, the control unit 7 controls the driving unit 43 to move the cluster spraying head 3 from one end side to the other end side (e.g., the right end side in FIG. 1) of the wafer W. The first to the third cleaning agent supplied to the first to the third nozzle 31c to 33c are sprayed toward the wafer W in the processing chamber 1. Since, however, the processing chamber 1 is depressurized by the vacuum pump 6, the sprayed first to third cleaning agents are adiabatically expanded, thereby generating clusters of the first to the third cleaning agent molecules. The generated clusters of the first to the third cleaning agent collide with the surface of the wafer W.

When the cluster spraying head 3 is moved and the clusters of the first cleaning agent are sprayed to the wafer W, the first type of cleaning target objects are decomposed by the first cleaning agent as shown in FIG. 7. Then, the separated cleaning target objects are blown toward the first suction unit 31d by the clusters of the first cleaning agent sprayed to the wafer W and sucked by the first suction unit 31d. When the cluster spraying head 3 is moved and the clusters of the second cleaning agent are sprayed to the portion to which the clusters of the first cleaning agent have been sprayed as shown in FIG. 8, the second type of cleaning target objects are decomposed and sucked by the second suction unit 32d. When the cluster spraying head 3 is moved and the clusters of the third cleaning agent are sprayed to the portion to which the clusters of the third cleaning agent have been sprayed as shown in FIG. 9, the third type of cleaning target objects are decomposed and sucked by the third suction unit 33d. In other words, various cleaning target objects can be removed by spraying the clusters of the first to the third cleaning agent.

In accordance with the substrate cleaning apparatus and the substrate cleaning method of the present embodiment, various contaminants can be removed, compared to ultra-low temperature aerosol spray, while avoiding the technical problems inherent to the wet cleaning.

Particularly, since various cleaning target objects are adhered to the wafer W after etching of a multilayer structure, the substrate cleaning apparatus and the substrate cleaning method of the present embodiment can be effectively used.

The substrate cleaning apparatus and the substrate cleaning method of the present embodiment can be applied to mask cleaning of an apparatus for manufacturing a multilayer device such as an organic EL. As for an organic deposition method of an organic EL, a linear source method is used. In this deposition method, a mask is installed on a glass substrate, and a plurality of organic materials is continuously deposited. Since the mask is repeatedly used, a plurality of organic materials is deposited on the mask surface. In order to prevent the deposits from being peeled off during film formation to contaminate the substrate, the mask needs to be cleaned or exchanged at regular intervals. Thus, the substrate cleaning apparatus of the present embodiment is provided to the multilayer device manufacturing apparatus, and clusters of cleaning agents are continuously sprayed to remove a plurality of organic materials. Accordingly, the mask can be cleaned, and the organic EL can be effectively manufactured.

Further, the decomposed cleaning target objects can be blown toward the first to the third suction unit 31d to 33d by the transfer of the first to the third nozzle 31c to 33c and the spraying of the clusters so as to be sucked by the first to the third suction unit 31d to 33d.

In the above configuration, the cluster spraying head 3 is moved, so that the processing chamber 1 can be scaled down compared to the case in which the wafer W is moved.

Although, in the above-described embodiment, the cluster spraying head is provided with three nozzles and three suction units, the cluster spraying head may be provided with two nozzles and two suction units, or may be provided with four or more nozzles and four or more suction units.

FIGS. 10A to 10C conceptually explain an example of a substrate cleaning method performed by using four cleaning agents. FIG. 10A shows a wafer W before etching. An insulating layer, a gate and a resist are sequentially deposited on the wafer W, thereby forming a multilayer structure. FIG. 10B shows the wafer W after the etching. After the etching of the multilayer structure, an organic-based residue, a metal-based residue, and other particles are attached to the wafer W. The substrate cleaning apparatus in which four nozzles and four suction units are provided to the cluster spraying head is configured to supply an organic solvent to the first nozzle, $O_3$ to the second nozzle, hydrochloric acid to the third nozzle, and $N_2$ gas to the fourth nozzle. First, an organic-based cleaning target is decomposed by spraying clusters of the organic solvent and, then, an organic material other than a resist is decomposed by spraying clusters of $O_3$. Thereafter, metal is decomposed by spraying clusters of hydrochloric acid. Lastly, the decomposed cleaning target objects are removed from the wafer by spraying $N_2$ gas. In accordance with the substrate cleaning apparatus configured as described above, the resist, the organic-based residue, the metal-based residue and the particles can be removed from the wafer W.

Meanwhile, the following configuration may be added in order to facilitate reaction between a cleaning agent and a cleaning target object. For example, an electronic beam irradiation unit for irradiating an electronic beam to a wafer W may be provided to the substrate cleaning apparatus. Further, an ionization unit for ionizing clusters of the cleaning agent may be provided to the substrate cleaning apparatus. Moreover, a heating unit for heating the wafer W may be provided to the substrate cleaning apparatus. The heating unit may include, e.g., a heater disposed to a substrate support, an infrared lamp for irradiating infrared rays to a wafer W, or the like. Furthermore, a reaction facilitation gas supply unit for supplying a gas for facilitating reaction between a cleaning agent and a cleaning target object to the processing chamber 1 may be provided to the processing chamber 1.

Although, in the above embodiment, there has been described the configuration in which a single nozzle arm is provided with a plurality of nozzles, it is also possible to employ a configuration in which a plurality of nozzle arms is provided and each of the nozzle arms is provided with a plurality of nozzles. In that case, each of the nozzle arms may be provided with a nozzle for spraying a single cleaning agent.

First Modification

A substrate cleaning apparatus in accordance with a first modification of the above-described embodiment is configured to transfer cleaning target objects decomposed by spraying clusters of cleaning agents to the first to the third suction unit by a transfer gas. The substrate cleaning apparatus in accordance with the first modification is the same as that of the above-described embodiment except for the configurations of the first to the third nozzle and the transfer gas, so that only the differences will be described hereinafter.

Figure 11:
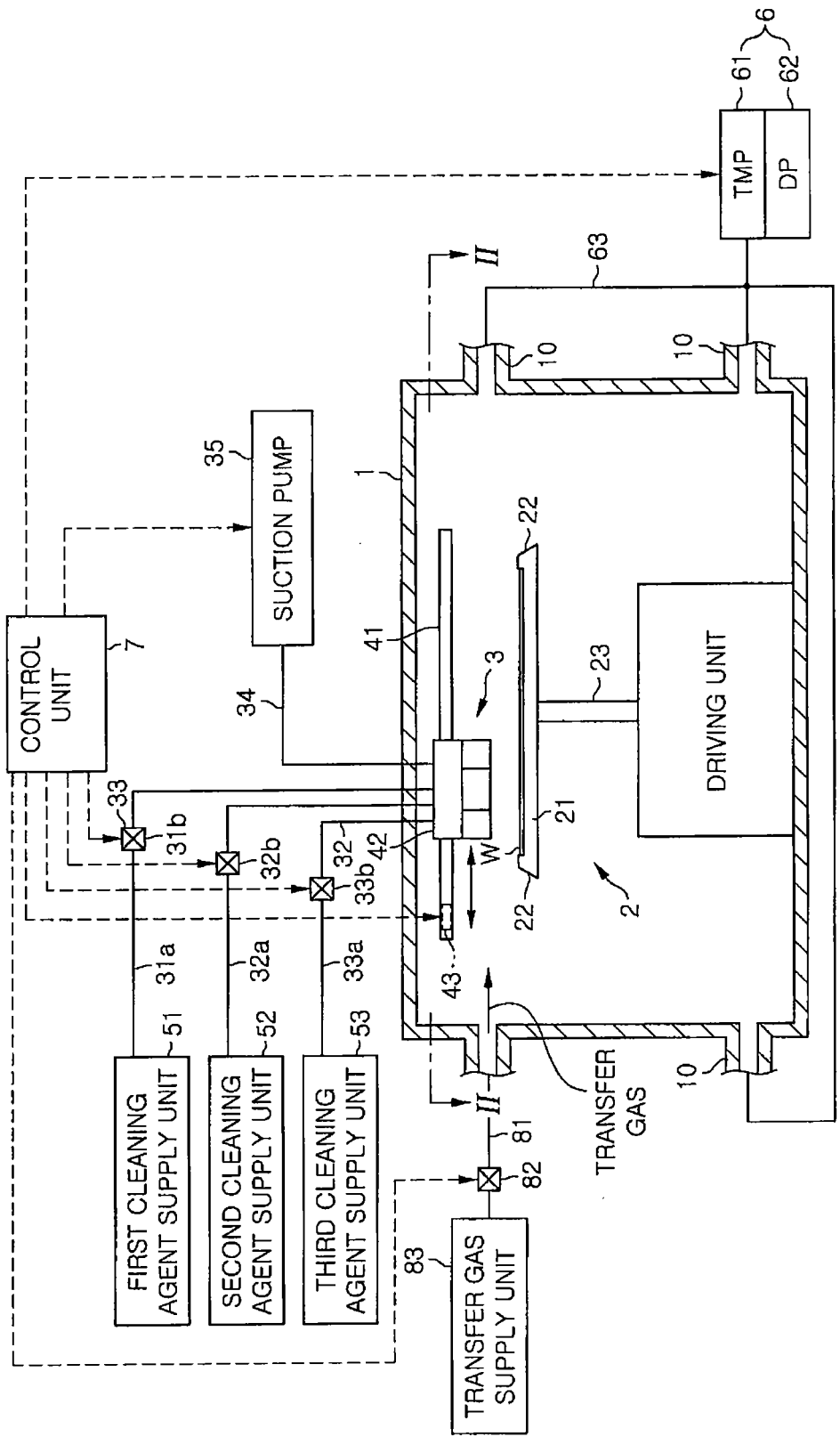
FIG. 11 is a side cross sectional view schematically showing a configuration example of a substrate cleaning apparatus in accordance with a first modification.
Figure 12:
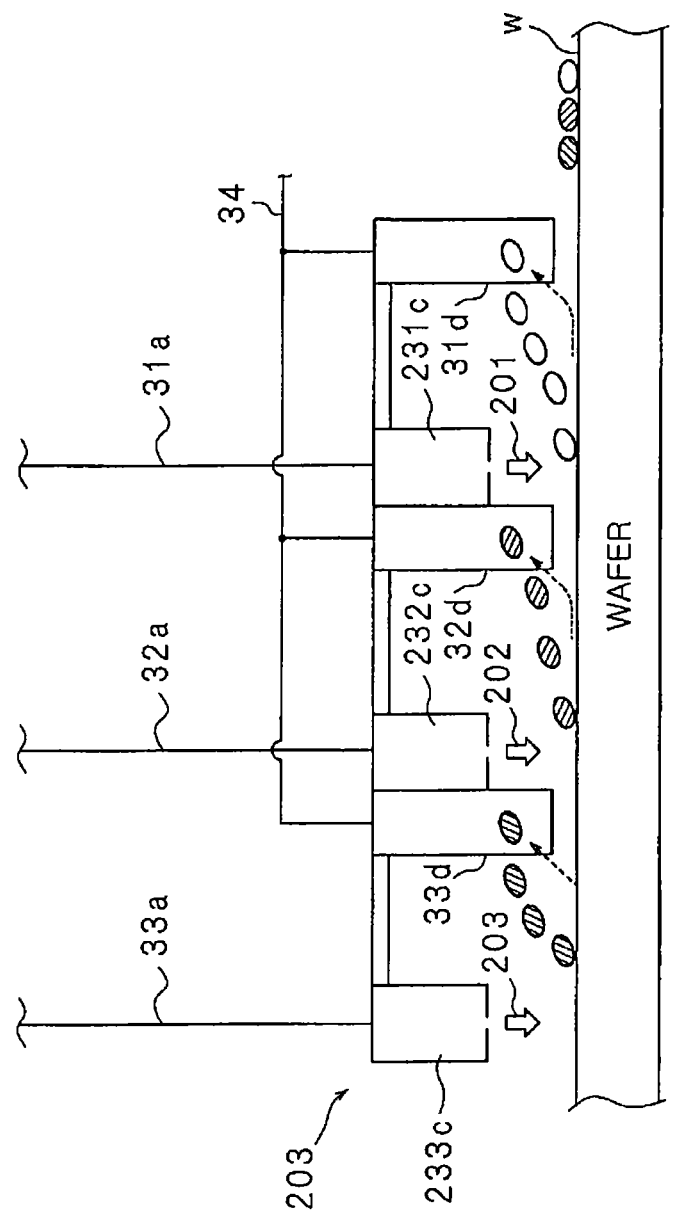
FIG. 12 is a side cross sectional view schematically showing a configuration example of a cluster spraying head in accordance with the first modification.

FIG. 11 is a side cross sectional view schematically showing a configuration example of a substrate cleaning apparatus in accordance with this first modification. FIG. 12 is a side cross sectional view schematically showing a configuration example of a cluster spraying head 203 in accordance with the first modification. A first to a third nozzle 231c to 233c of the cluster spraying head 203 of the substrate cleaning apparatus in accordance with the first modification are supported by the nozzle arm 42 such that the spraying directions of the cleaning agents become substantially perpendicular to the wafer W. When the clusters of the cleaning agents are sprayed in a direction substantially perpendicular to the wafer W having a pattern shown in FIG. 10B, the cleaning effect can be further improved compared to when the clusters of the cleaning agents are sprayed obliquely.

In other words, in the embodiment shown in FIG. 3, the first to the third nozzle 31c to 33c are arranged such that the spraying direction of the clusters are not perpendicular to the wafer W. However, the cleaning agents are locally blocked by the pattern formed on the wafer W, and the cleaning agents may not collide with certain portions of the wafer W. Therefore, as shown in FIG. 12, by arranging the first to the third nozzles 231c to 233c such that the spraying directions of the clusters become perpendicular to the wafer W, the cleaning gas is not locally blocked, and the clusters collide with the entire wafer W.

Further, a transfer gas ejection port 13 for ejecting onto the surface of the wafer W a transfer gas for transferring the decomposed cleaning target objects toward the first to the third suction unit 31d to 33d is formed at a proper location of a sidewall of the processing chamber 1. For example, the transfer gas ejection port 13 may be provided at a portion facing the gas exhaust port 10 disposed above the table portion 21. With such configuration, the transfer gas flows along the surface of the wafer W and is exhausted to the outside of the processing chamber 1, which makes it possible to prevent readhesion of the decomposed cleaning target object to the surface of the wafer W. The transfer gas ejection port 13 is connected to a transfer gas supply line 81 connected to a transfer gas supply unit 83 for supplying a transfer gas such as Ar gas, $N_2$ gas or the like.

The transfer gas supply unit 83 is provided with an on-off valve 82. The on-off operation of the on-off valve 82 is controlled by the control unit 7. Although the on-off timing of the on-off valve 82 is not particularly limited, it is preferable to employ, e.g., a configuration in which the first to the third on-off valve and the on-off valve 82 are alternately opened and closed by the control unit 7. By alternately performing the spraying of the clusters of the first to the third cleaning agent and the removal of the cleaning target objects decomposed by spraying the clusters, it is possible to prevent the spraying of the clusters to the wafer W from being disturbed by the flow of the transfer and also possible to effectively remove the cleaning target objects. In addition, the spraying of the clusters of the cleaning agents and the supply of the transfer gas may be performed together by optimizing the flow rate of the transfer gas.

In accordance with the substrate cleaning apparatus and the substrate cleaning method of the first modification, the cleaning target objects can be more effectively separated by spraying the cleaning agents in a direction substantially perpendicular to the wafer W. Furthermore, the decomposed cleaning target objects can be effectively sucked by ejecting the transfer gas to the wafer W.

In the first modification, the transfer gas ejection port and the first to the third suction unit are provided. However, it is possible to omit the first to the third suction unit and transfer the cleaning target objects to the outside by the transfer gas ejected from the transfer gas ejection port.

Second Modification

In a substrate cleaning apparatus in accordance with a second modification of the above-described embodiment, a wafer is moved while a cluster spraying head is fixed to a processing chamber. The substrate cleaning apparatus in accordance with the second modification is the same as that of the above-described embodiment except for such configuration, so that only the differences will be described hereinafter.

Figure 13:
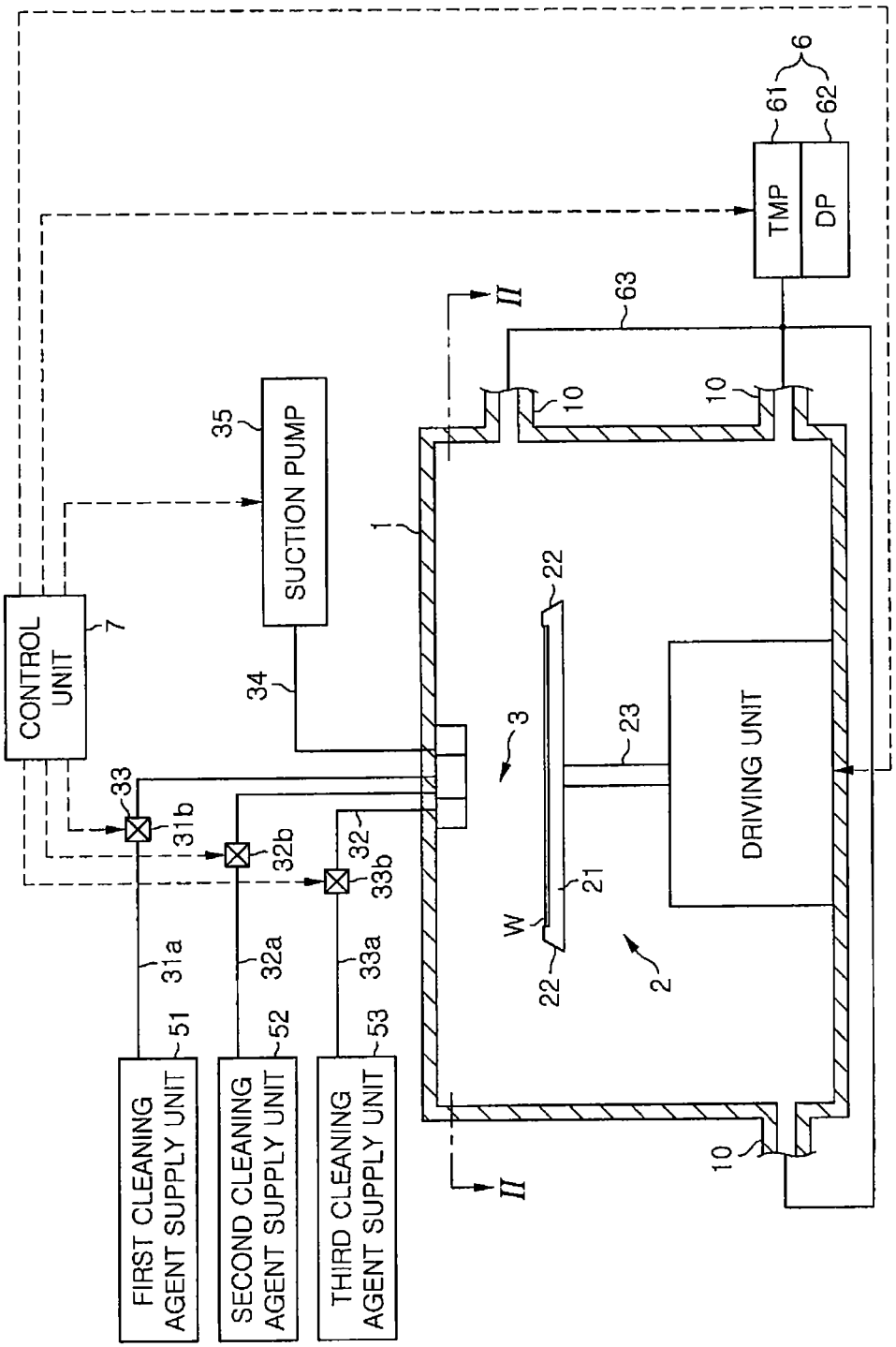
FIG. 13 is a side cross sectional view schematically showing a configuration example of a substrate cleaning apparatus in accordance with a second modification.

FIG. 13 is a side cross sectional view schematically showing a configuration example of a substrate cleaning apparatus in accordance with the second modification. The substrate cleaning apparatus in accordance with the second modification includes a processing chamber 301 in which the cluster spraying head 3 is fixed to a substantially central portion of a ceiling plate thereof. Further, a driving unit 343 for moving the table portion 21 in a horizontal direction is provided at a bottom portion of the processing chamber 301. The driving unit 343 can move the table portion 21 within the range in which the entire surface of the wafer W can be scanned by the cluster spraying head 3. Moreover, the processing chamber 301 has a horizontal width required to move the table portion 21 within the range in which the entire surface of the wafer W can be scanned by the cluster spraying head 3. Furthermore, the driving unit 343 serves as a unit for relatively moving the substrate and the cluster spraying unit along the surface of the substrate to which cleaning target objects have adhered.

In the second modification, the cluster spraying head 3 is fixed to the ceiling plate of the processing chamber 301. Therefore, it is possible to reduce the possibility in which the wafer W is contaminated by particles from the driving unit 343, compared to the first embodiment.

The above embodiments have been described for illustrative purpose only and the present invention is not limited thereto. The scope of the invention is disclosed in the accompanying claims and thus is not restricted by the above embodiments. Further, the accompanying claims and their equivalents are intended to cover various modifications.

What is claimed is:

1. A substrate cleaning apparatus for cleaning a substrate to which cleaning target objects have adhered, comprising:
   a cluster spraying unit for spraying the substrate with one or more types of clusters formed of cleaning agent molecules agglomerated together;
   a suction unit for sucking cleaning target objects separated by spraying the clusters of the cleaning agent molecules;
   a unit for relatively moving the substrate and the cluster spraying unit along a surface of the substrate to which the cleaning target objects have adhered;
   a suction pump connected to the suction unit;
   a container for accommodating the substrate;
   a vacuum pump for decreasing a pressure in the container; and
   cleaning agent accommodating units which accommodate cleaning agents,
   wherein the cluster spraying unit includes supply lines for supplying the cleaning agents from the cleaning agent accommodating units and a plurality of nozzles for spraying the cleaning agents supplied through the supply lines,
   wherein each of the cleaning agent accommodating units is connected to one of the nozzles through one of the supply lines in a one to one corresponding manner,
   wherein the nozzles are installed side by side,
   wherein the suction unit includes a suction line connected to the suction pump and a plurality of suction members connected to the suction pump via the suction line, each of the suction members being provided correspondingly to each of the nozzles, and
   wherein the supply lines are separated from the suction line.

2. The substrate cleaning apparatus of claim 1, further comprising:
   a unit for ejecting onto the substrate a transfer gas for transferring the cleaning target objects separated by spraying the clusters of the cleaning agent molecules to the outside
   of the container or toward the suction members.

3. The substrate cleaning apparatus of claim 1, wherein a spraying opening of each of the nozzles has a line-shaped cross section.

4. The substrate cleaning apparatus of claim 1, further comprising a holding member which holds the nozzles such that spraying directions of the cleaning agents are not perpendicular to the substrate.

5. The substrate cleaning apparatus of claim 1, wherein the cleaning agent molecules are selected from the group consisting of an organic solvent, hydrogen fluoride, hydrochloric acid, ozone, ammonia and hydrogen peroxide, water, isopropyl alcohol, nitrogen, and argon.

6. The substrate cleaning apparatus of claim 1, further comprising a first gas exhaust port disposed in the vicinity of the cluster spraying unit; and a second gas exhaust port at lower portions of sidewalls of the container, wherein the first gas exhaust and second gas exhaust port are connected to the vacuum pump.

7. The substrate cleaning apparatus of claim 2, further comprising
   a first gas exhaust port disposed in the vicinity of the cluster spraying unit; and
   a second gas exhaust port at lower portions of sidewalls of the container, wherein the first gas exhaust port and second gas exhaust port are connected to the vacuum pump.

8. The substrate cleaning apparatus of claim 2, further comprising
   a gas exhaust port provided at a sidewall of the container and disposed above a table on which the substrate is to be mounted; and
   wherein the unit for ejecting onto the substrate the transfer gas includes a transfer gas ejection port through which the transfer gas is supplied, and the transfer gas ejection port is disposed opposite to the gas exhaust port with the table therebetween such that the transfer gas flows along a surface of the substrate.

9. The substrate cleaning apparatus of claim 1, wherein each of the cleaning agent accommodating units accommodates a different cleaning agent.

* * * * *